(12) United States Patent
Kuzuya et al.

(10) Patent No.: US 11,171,164 B2
(45) Date of Patent: Nov. 9, 2021

(54) IMAGE SENSOR, IMAGE PROCESSING METHOD, AND ELECTRONIC DEVICE

(71) Applicant: SONY SEMICONDUCTOR SOLUTIONS CORPORATION, Kanagawa (JP)

(72) Inventors: Naoki Kuzuya, Tokyo (JP); Hiroshi Sumihiro, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 207 days.

(21) Appl. No.: 15/739,500

(22) PCT Filed: Jun. 17, 2016

(86) PCT No.: PCT/JP2016/068051
§ 371 (c)(1),
(2) Date: Dec. 22, 2017

(87) PCT Pub. No.: WO2017/006746
PCT Pub. Date: Jan. 12, 2017

(65) Prior Publication Data
US 2018/0190687 A1    Jul. 5, 2018

(30) Foreign Application Priority Data

Jul. 3, 2015  (JP) .............................. JP2015-134484

(51) Int. Cl.
*H01L 27/00* (2006.01)
*H01L 27/146* (2006.01)
(Continued)

(52) U.S. Cl.
CPC ...... *H01L 27/146* (2013.01); *H01L 27/14614* (2013.01); *H01L 27/14616* (2013.01);
(Continued)

(58) Field of Classification Search
CPC ...... H01L 27/146; H04N 5/232; H04N 5/341; H04N 5/374; H04N 5/343; H04N 5/23229;
(Continued)

(56) References Cited

U.S. PATENT DOCUMENTS 6,624,849 B1    9/2003  Nomura
6,753,904 B1    6/2004  Nomura
(Continued)

FOREIGN PATENT DOCUMENTS

CN    102202189 A     9/2011
EP    2323409 A2 *   5/2011  ............. H04N 5/347
(Continued)

OTHER PUBLICATIONS

International Search Report and Written Opinion of PCT Application No. PCT/JP2016/068051, dated Aug. 23, 2016, 10 pages of ISRWO.

(Continued)

*Primary Examiner* — Georgia Y Epps
*Assistant Examiner* — Kevin Wyatt
(74) *Attorney, Agent, or Firm* — Chip Law Group

(57) ABSTRACT

The present disclosure relates to an image sensor, an image processing method, and an electronic device capable of executing image processing with fewer resources. The image sensor is provided with a pixel region in which pixels each including a photoelectric conversion unit which converts light to a charge and an in-pixel memory unit which holds the charge generated in the photoelectric conversion unit are arranged in a matrix manner, a driving unit which drives to read out a pixel signal from the pixel, and an image processing unit which performs image processing based on a plurality of images read out by a plurality of times of readout from the pixel region according to driving of the (Continued)

driving unit. The present technology may be applied to, for example, an image sensor including a logic circuit.

7 Claims, 12 Drawing Sheets

(51) Int. Cl.
- *H04N 5/232* (2006.01)
- *H04N 5/378* (2011.01)
- *H04N 5/345* (2011.01)
- *H04N 5/343* (2011.01)
- *H04N 5/369* (2011.01)
- *H04N 5/341* (2011.01)
- *H04N 5/374* (2011.01)

(52) U.S. Cl.
CPC ..... *H04N 5/23218* (2018.08); *H04N 5/23219* (2013.01); *H04N 5/23229* (2013.01); *H04N 5/341* (2013.01); *H04N 5/343* (2013.01); *H04N 5/3456* (2013.01); *H04N 5/369* (2013.01); *H04N 5/374* (2013.01); *H04N 5/378* (2013.01)

(58) Field of Classification Search
CPC ... H04N 5/3456; H04N 5/378; H04N 5/23219
USPC ...................................... 250/208.1
See application file for complete search history.

(56) References Cited

U.S. PATENT DOCUMENTS

| | | | | |
|---|---|---|---|---|
| 7,378,694 | B2* | 5/2008 | Yi | H01L 27/14609 257/239 |
| 8,514,303 | B2* | 8/2013 | Wach | H04N 5/335 348/241 |
| 2006/0204055 | A1* | 9/2006 | Steinberg | H04N 5/23212 382/118 |
| 2008/0317357 | A1* | 12/2008 | Steinberg | G06T 5/003 382/209 |
| 2009/0256926 | A1 | 10/2009 | Okada et al. | |
| 2011/0074970 | A1* | 3/2011 | Sukegawa | G06K 9/00261 348/222.1 |
| 2011/0221921 | A1* | 9/2011 | Okamoto | H04N 5/232 348/222.1 |
| 2011/0234836 | A1 | 9/2011 | Machida | |
| 2014/0084142 | A1 | 3/2014 | Machida | |
| 2014/0320668 | A1* | 10/2014 | Kalevo | H04N 5/23212 348/169 |
| 2015/0009352 | A1* | 1/2015 | Shibagami | H04N 5/23212 348/218.1 |
| 2016/0006959 | A1 | 1/2016 | Machida | |
| 2017/0332008 | A1* | 11/2017 | Tsuchiya | H04N 5/23245 |

FOREIGN PATENT DOCUMENTS

| | | |
|---|---|---|
| JP | 2000-059699 A | 2/2000 |
| JP | 2009-252118 A | 10/2009 |
| JP | 2011-204878 A | 10/2011 |
| JP | 2012-165193 A | 8/2012 |
| JP | 2015-041792 A | 3/2015 |
| KR | 10-2011-0107750 A | 10/2011 |
| TW | 201143416 A | 12/2011 |

OTHER PUBLICATIONS

Viola, et al.,"Rapid Object Detection using a Boosted Cascade of Simple Features", Accepted Conference on Computer Vision and Pattern Recognition 2001, 09 pages.

Kumar, et al.,"Attribute and Simile Classifiers for Face Verification", Columbia University, 08 pages.

* cited by examiner

FIG. 5
PAST IMAGE
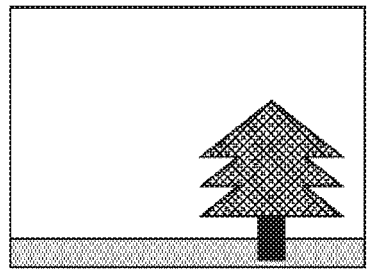
CURRENT IMAGE
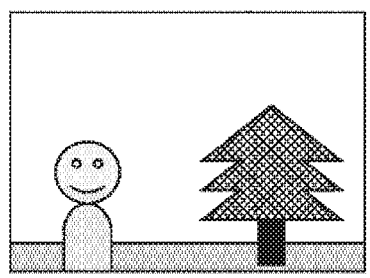
MOVING OBJECT PIXEL
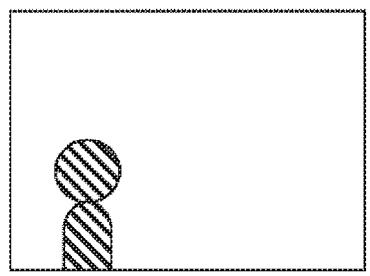
MOVING OBJECT REGION
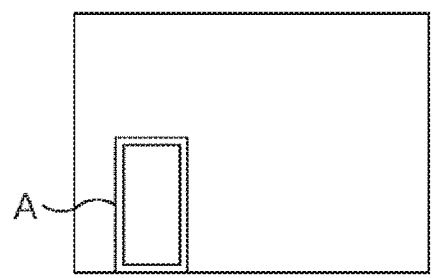

FIG. 6
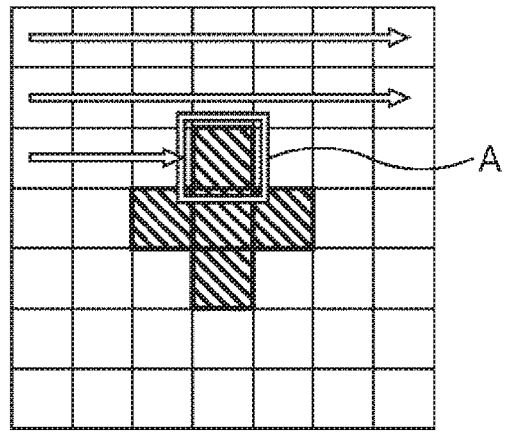
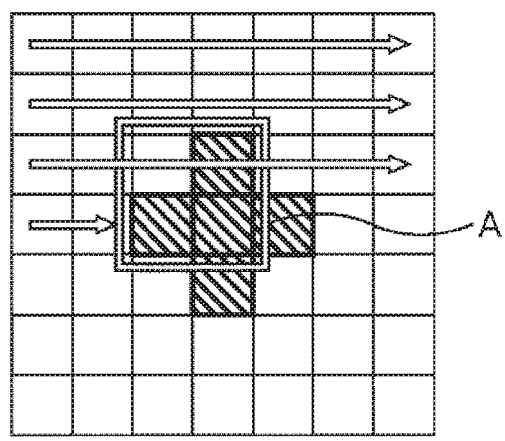
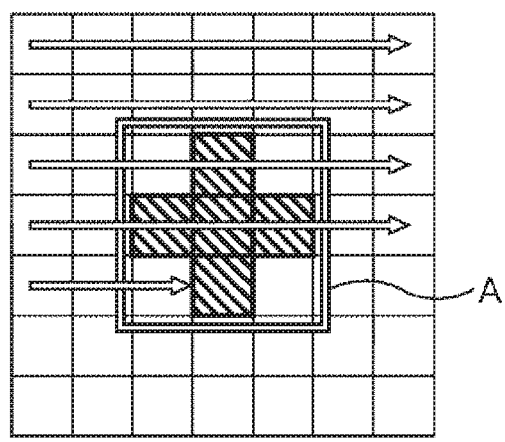

IMAGE SENSOR, IMAGE PROCESSING METHOD, AND ELECTRONIC DEVICE

CROSS REFERENCE TO RELATED APPLICATIONS

This application is a U.S. National Phase of International Patent Application No. PCT/JP2016/068051 filed on Jun. 17, 2016, which claims priority benefit of Japanese Patent Application No. JP 2015-134484 filed in the Japan Patent Office on Jul. 3, 2015. Each of the above-referenced applications is hereby incorporated herein by reference in its entirety.

TECHNICAL FIELD

The present disclosure relates to an image sensor, an image processing method, and an electronic device, and especially relates to an image sensor, an image processing method, and an electronic device capable of executing image processing with fewer resources.

BACKGROUND ART

Generally, in an imaging apparatus provided with an image sensor such as a charge coupled device (CCD) and a complementary metal oxide semiconductor (CMOS) image sensor, light from a subject is condensed by an optical system and an image is formed on a sensor surface of the image sensor, thereby capturing an image of the subject. The image sensor has a pixel obtained by combining a photodiode (PD) which performs photoelectric conversion and a plurality of transistors, and an image is constructed on the basis of pixel signals output from a plurality of pixels arranged on an image surface on which the image of the subject is formed.

Also, in recent years, higher performance of the image sensor is required, and development of the image sensor capable of performing image recognition processing and the like by incorporating a logic circuit is under way. For example, as the image recognition processing performed by the image sensor, face detection processing (refer to Non-Patent Document 1) of detecting a face captured in a captured image, face attribute detection processing (refer to Non-Patent Document 2) of detecting an attribute (sex, age and the like) of a person from a face image are assumed.

When the image recognition processing is executed on a certain image, processing in a plurality of stages is often combined. For example, processing is performed in a plurality of stages so as to read an image first to extract some information therefrom, and read the image again to extract another information from the information first extracted and the image read again.

However, in a case where the image recognition processing is executed inside the image sensor, a structure is such that image data is sequentially read out from the pixel on an upper left side of a screen in a raster scan order and flows to a subsequent stage logic in a pipeline, so that the structure is generally such that the data once read out cannot be used again. Therefore, for example, by adopting a structure including a frame memory for storing an image of one frame in the logic circuit of the image sensor, it is possible to use the same image in processing in a plurality of stages, but in general, if such a memory region is provided, a circuit scale of the image sensor becomes large. For example, in a case where the frame memory for storing the image of one frame is provided in the logic circuit of the image sensor, not only a manufacturing cost but also power consumption increase.

For example, Patent Document 1 discloses an imaging apparatus that enables two-pass processing by using a global shutter pixel as a memory. In this imaging apparatus, the global shutter pixel is used for image readout over a plurality of vertical synchronization periods, so that processing is not performed a plurality of times at the same exposure timing.

CITATION LIST

Patent Document

Patent Document 1: Japanese Patent Application Laid-Open No. 2012-165193

Non-Patent Document

Non-Patent Document 1: Viola, et al., "Rapid object detection using a boosted cascade of simple features", Proceedings of the 2001 IEEE Computer Society Conference on Computer Vision and Pattern Recognition Non-Patent Document 2: Kumar, et al., "Attribute and Simile Classifiers for Face Verification", 2009 IEEE 12th International Conference on Computer Vision

SUMMARY OF THE INVENTION

Problems to be Solved by the Invention

As described above, it is difficult to execute image processing in which processing in a plurality of stages is combined inside the image sensor, and it is required to execute such image processing with less resources.

The present disclosure is made in view of such a situation, and an object thereof is to make it possible to execute the image processing with less resources.

Solutions to Problems

An image sensor according to one aspect of the present disclosure is provided with a pixel region in which pixels each including a photoelectric conversion unit which converts light to a charge and an in-pixel memory unit which holds the charge generated in the photoelectric conversion unit are arranged in a matrix manner, a driving unit which drives to read out a pixel signal from the pixel, and an image processing unit which performs image processing based on a plurality of images read out by a plurality of times of readout from the pixel region according to driving of the driving unit.

An image processing method according to one aspect of the present technology is an image processing method of an image sensor provided with a pixel region in which pixels each including a photoelectric conversion unit which converts light to a charge and an in-pixel memory unit which holds the charge generated in the photoelectric conversion unit are arranged in a matrix manner, and a driving unit which drives to read out a pixel signal from the pixel, the method including performing image processing based on a plurality of images read out by a plurality of times of readout from the pixel region according to driving of the driving unit.

An electronic device according to one aspect of the present technology is provided with an image sensor including a pixel region in which pixels each including a photoelectric conversion unit which converts light to a charge and an in-pixel memory unit which holds the charge generated in the photoelectric conversion unit are arranged in a matrix manner, a driving unit which drives to read out a pixel signal from the pixel, and an image processing unit which performs image processing based on a plurality of images read out by a plurality of times of readout from the pixel region according to driving of the driving unit.

According to one aspect of the present disclosure, an image sensor is provided with a pixel region in which pixels each including a photoelectric conversion unit which converts light into a charge and an in-pixel memory unit which holds the charge generated in the photoelectric conversion unit are arranged in a matrix manner, and a driving unit which drives to read out the pixel signal from the pixel. Then, according to the driving of the driving unit, readout is performed a plurality of times from the pixel region, and image processing based on a plurality of read images is performed.

Effects of the Invention

According to one aspect of the present disclosure, image processing may be executed with fewer resources.

BRIEF DESCRIPTION OF DRAWINGS

FIG. 5 is a view for illustrating a moving object region specification processing.

FIG. 6 is a view for illustrating a method of obtaining a moving object region.

MODE FOR CARRYING OUT THE INVENTION

Hereinafter, a specific embodiment to which the present technology is applied is described in detail with reference to the drawings.

First Embodiment of Image Sensor

Figure 1:
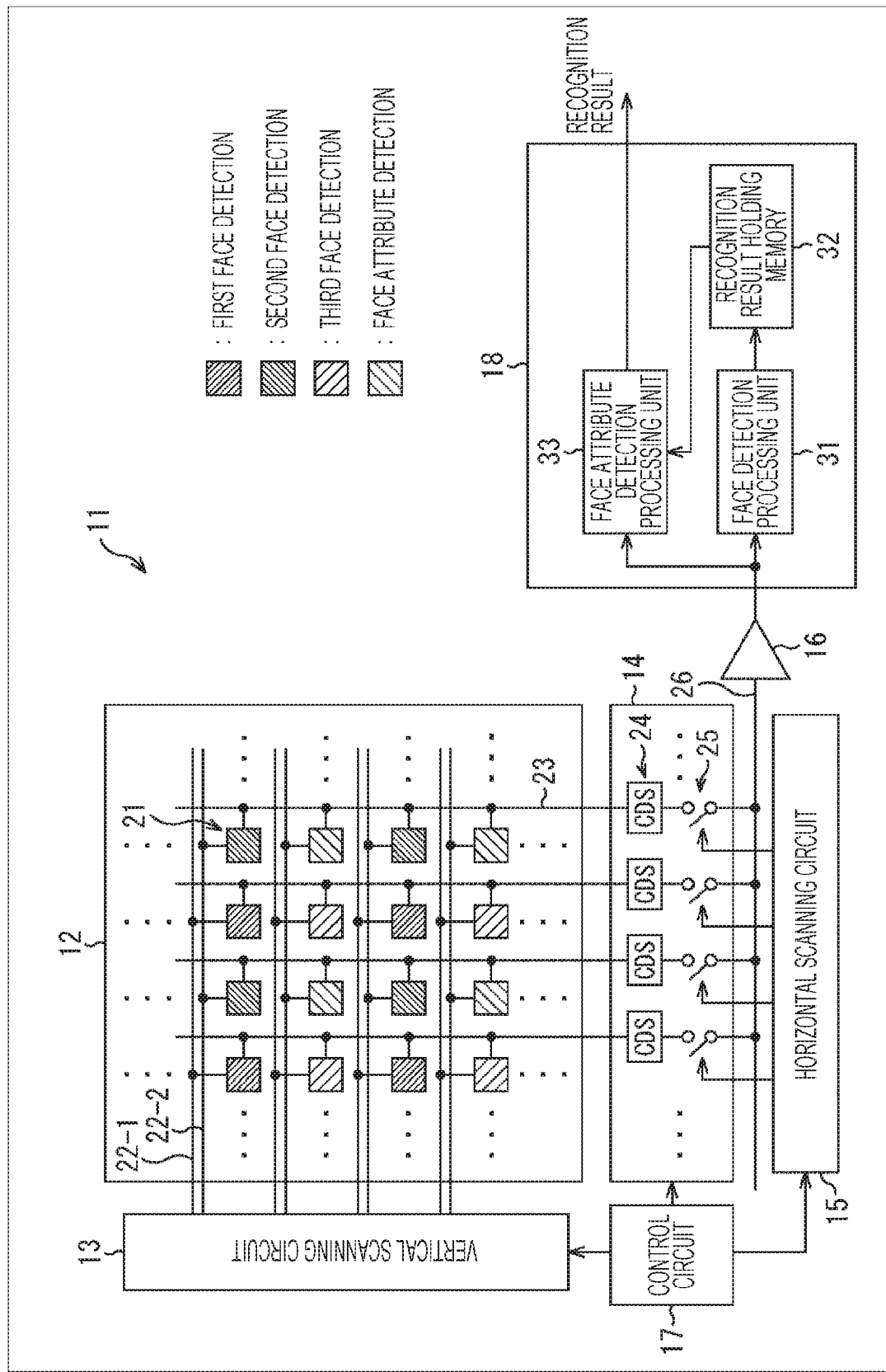
FIG. 1 is a block diagram illustrating a configuration example of a first embodiment of an image sensor.

FIG. 1 is a block diagram illustrating a configuration example of a first embodiment of an image sensor to which this technology is applied.

As illustrated in FIG. 1, an image sensor 11 is provided with a pixel region 12, a vertical scanning circuit 13, a column signal processing circuit 14, a horizontal scanning circuit 15, an output circuit 16, a control circuit 17, and a logic circuit 18.

The pixel region 12 is a light receiving surface which receives light condensed by an optical system not illustrated. In the pixel region 12, a plurality of pixels 21 is arranged in a matrix manner, and the pixels 21 are connected to the vertical scanning circuit 13 row by row via horizontal signal lines 22 and to the column signal processing circuit 14 column by column via vertical signal lines 23. Each of a plurality of pixels 21 outputs a pixel signal at a level according to a light amount of the received light, and an image of a subject to be formed in the pixel region 12 is constructed from the pixel signals.

The vertical scanning circuit 13 sequentially supplies driving signals for driving (transferring, selecting, resetting and the like) the respective pixels 21 for respective rows of a plurality of pixels 21 arranged in the pixel region 12, to the pixels 21 via the horizontal signal lines 22.

The column signal processing circuit 14 performs correlated double sampling (CDS) processing on the pixel signals output from a plurality of pixels 21 via the vertical signal lines 23, thereby performing AD conversion on the pixel signals and removing reset noise therefrom.

The horizontal scanning circuit 15 sequentially supplies driving signals for allowing the column signal processing circuit 14 to output the pixel signals to a data output signal line 24 for respective columns of a plurality of pixels 21 arranged in the pixel region 12 to the column signal processing circuit 14.

The output circuit 16 amplifies the pixel signals supplied from the column signal processing circuit 14 via the data output signal line 24 at a timing according to the driving signal of the horizontal scanning circuit 15 to a predetermined level to output.

The control circuit 17 generates and supplies a clock signal according to a driving cycle of each block forming the image sensor 11, thereby controlling driving of each block.

The logic circuit 18 is formed on a semiconductor substrate stacked on a semiconductor substrate on which the pixels 21 are formed, for example, and may perform various types of image processing on the pixel signals supplied via the output circuit 16. For example, FIG. 1 illustrates a configuration example of the logic circuit 18 which performs image recognition processing of detecting a face attribute; as illustrated, the logic circuit 18 includes a face detection processing unit 31, a recognition result holding memory 32, and a face attribute detection processing unit 33.

The face detection processing unit 31 performs face detection processing of detecting a face captured in a captured image captured by the image sensor 11 as preprocessing necessary for detecting the face attribute by the face attribute detection processing unit 33. For example, the face detection processing unit 31 may use various methods of detecting the face which are already proposed, and specifically, this may use the method proposed in Non-Patent Document 1 described above.

The recognition result holding memory 32 holds face detection information (for example, a position and a size of a rectangular region in which the face is captured) as a recognition result obtained as a result of the face detection processing performed by the face detection processing unit 31.

The face attribute detection processing unit 33 reads out the recognition result held in the recognition result holding memory 32 and performs face attribute detection processing of detecting the attribute of the face captured in the captured image captured by the image sensor 11. For example, the face attribute detection processing unit 33 may use various methods of detecting the face attribute already proposed, and specifically, this may use the method proposed in Non-Patent Document 2 described above. Then, the face attribute detection processing unit 33 outputs face attribute information (for example, sex, age and the like obtained from the face) obtained as a result of performing the face attribute detection processing to a block on a subsequent stage not illustrated.

Herein, in the image sensor 11, two horizontal signal lines 22-1 and 22-2 are arranged for the pixels 21 in one row as illustrated; for example, the horizontal signal line 22-1 is connected to the pixels 21 in odd-numbered rows, and the horizontal signal line 22-2 is connected to the pixels 21 in even-numbered rows. Therefore, the vertical scanning circuit 13 may drive the pixels 21 so as to read the pixel signals from the odd-numbered rows and the even-numbered rows at different timings.

For example, the vertical scanning circuit 13 may drive to read the pixel signal from the pixel 21 in the odd-numbered column and the odd-numbered row, read the pixel signal from the pixel 21 in the even-numbered column and the odd-numbered row, read the pixel signal from the pixel 21 in the odd-numbered column and the even-numbered row, and read the pixel signal from the pixel 21 in the even-numbered column and the even-numbered row from the four pixels 21 arranged two by two vertically and horizontally. Therefore, the logic circuit 18 may perform image recognition processing on the captured image based on the pixel signals of the pixels 21 in the odd-numbered columns and the odd-numbered rows, the captured image based on the pixel signals of the pixels 21 in the odd-numbered columns and the even-numbered rows, the captured image based on the pixel signals of the pixels 21 in the even-numbered columns and the odd-numbered rows, and the captured image based on the pixel signals of the pixels 21 in the even-numbered columns and the even-numbered rows.

That is, in the image sensor 11, it is possible to take out four images of half size in vertical and horizontal directions by reading out the pixel signals while thinning out by one pixel in the vertical and horizontal directions, and the face detection processing and the face attribute detection processing are performed by using the four images. Meanwhile, although these images are not exactly the same, it is well-known that pixel values of most of adjacent pixels in a natural image have high correlation, and in the image recognition processing performed by the image sensor 11, they may be regarded as the same pixels.

In this manner, the image sensor 11 may read out the pixel signals a plurality of times according to arrangement positions of the pixels 21, and may perform the image recognition processing requiring a plurality of times of processing by the logic circuit 18. Therefore, out of the four captured images supplied to the logic circuit 18, the face detection processing unit 31 may perform the face detection processing three times for each face size using three captured images, and the face attribute detection processing unit 33 may perform the face attribute detection processing by using one captured image.

For example, the face detection processing unit 31 performs first face detection processing of detecting a large-sized face from the captured image by using the captured image based on the pixel signals of the pixels 21 in the odd-numbered columns and the odd-numbered rows. Similarly, the face detection processing unit 31 performs second face detection processing of detecting a medium-sized face from the captured image using the captured image based on the pixel signals of the pixels 21 in the odd-numbered columns and the even-numbered rows, and performs third face detection processing of detecting a small-sized face from the captured image by using the captured image based on the pixel signals of the pixels 21 in the odd-numbered columns and the even-numbered rows. Then, the face attribute detection processing unit 33 performs the face attribute detection processing by using the captured image based on the pixel signals of the pixels 21 in the even-numbered columns and the even-numbered rows.

In this manner, the image sensor 11 may supply the captured images to the logic circuit 18 in a plurality of times, and output the face attribute detected by the face attribute detection processing unit 33 as the recognition result of the image recognition processing of performing the processing a plurality of times by the logic circuit 18. Meanwhile, for example, the image sensor 11 may be used in a system which outputs only the recognition result obtained by performing the image recognition processing and is not required to output the image itself. For example, in a case where the image sensor 11 is used in a monitoring system, only the face attribute is output and the image in which the face is captured itself is not output, so that it is possible to protect privacy.

First Configuration Example of Pixel 21

Figure 2:
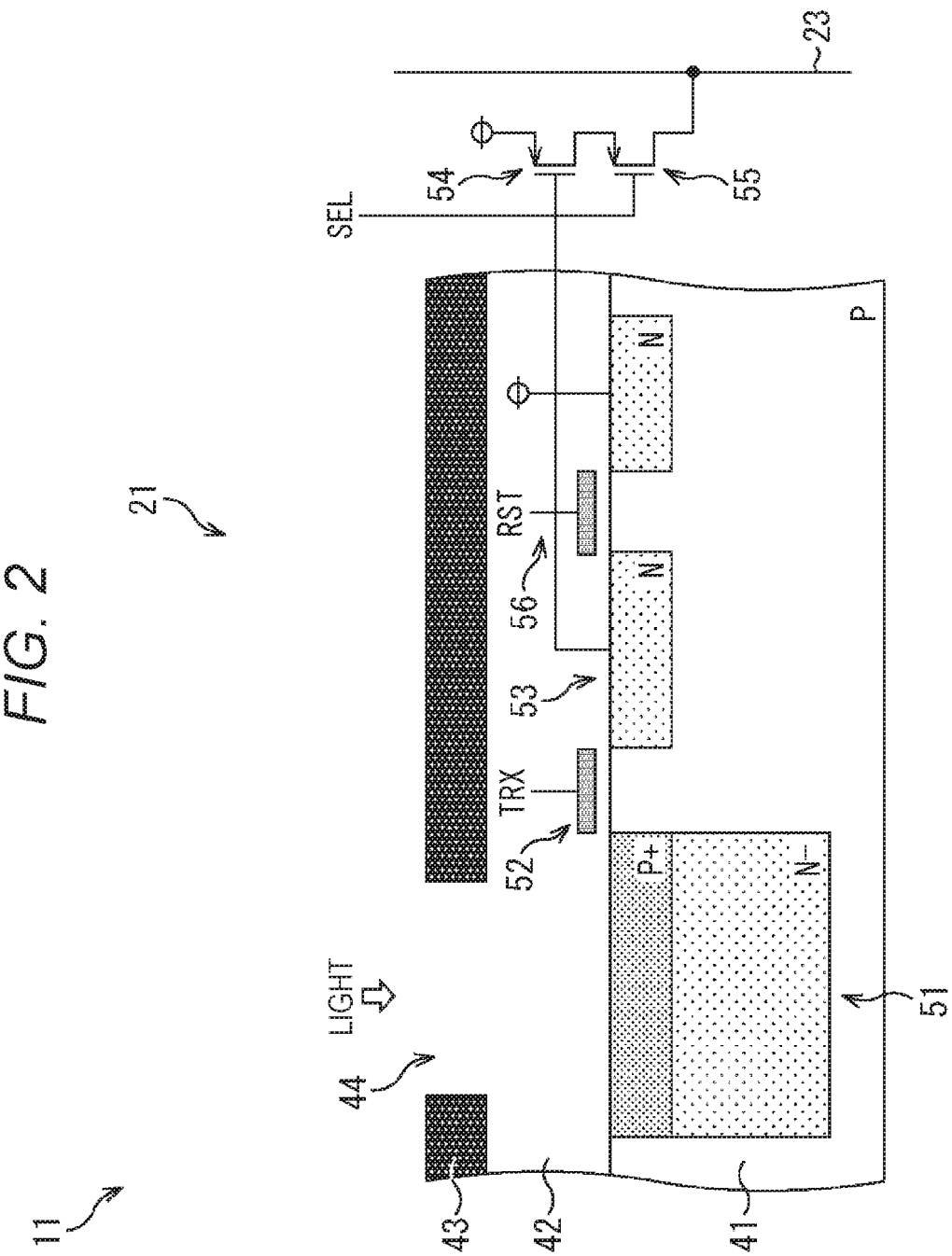
FIG. 2 is a view illustrating a first configuration example of a pixel.

FIG. 2 is a view illustrating a first configuration example of the pixel 21.

As illustrated in FIG. 2, the image sensor 11 includes a semiconductor substrate 41, a wiring layer 42, and a light shielding film 43 stacked on one another. Also, the pixel 21 is provided with a PD 51, a transfer transistor 52, a FD unit 53, an amplification transistor 54, a selection transistor 55, and a reset transistor 56.

In the semiconductor substrate 41, impurities are ion-implanted into, for example, a P-type silicon substrate (P-well) to form a P-type region (P+) and an N-type region (N−), thereby forming the PD 51 by PN junction thereof for each pixel 21. Also, in the semiconductor substrate 41, an N-type region (N) forming the FD unit 53 from the PD 51 via the transfer transistor 52 is formed, and an N-type region (N) connected from the FD unit 53 via the reset transistor 56 to a drain power source is formed, for each pixel 21.

Gate electrodes forming the transfer transistor 52 and the reset transistor 56 stacked on the semiconductor substrate 41 via an insulating film are formed, and wiring for supplying the driving signals to the gate electrodes is formed in the wiring layer 42. Also, in the wiring layer 42, wiring connecting the N-type region forming the FD unit 53 and a gate electrode forming the amplification transistor 54 is formed.

On the light shielding film 43, an opening 44 for the light irradiating the PD 51 formed in the semiconductor substrate 41 to enter is formed, and the light shielding film 43 shields the irradiation of a region other than the PD 51 by the light.

The pixel 21 of the image sensor 11 is configured in this manner, and the light incident via the opening 44 of the light shielding film 43 is subjected to photoelectric conversion by the PD 51 serving as a photoelectric conversion unit, and charges are accumulated in the PD 51. Then, when the transfer transistor 52 drives according to a transfer signal TRX supplied from the vertical scanning circuit 13 and the transfer transistor 52 is turned on, the charges accumulated in the PD 51 are transferred to the FD unit 53.

The FD unit 53 being a floating diffusion region which temporarily holds the charges transferred from the PD 51 serves as an in-pixel memory unit which holds the pixel signals inside the pixel 21. Also, with a configuration in which the FD unit 53 is connected to the gate electrode of the amplification transistor 54, the FD unit 53 and the amplification transistor 54 serve as a conversion unit which converts the charge generated in the PD 51 into the pixel signal at a level according to the charge.

Then, when the selection transistor 55 drives according to a selection signal SEL supplied from the vertical scanning circuit 13 and the selection transistor 55 is turned on, the amplification transistor 54 is put into a state connected to the vertical signal line 23 via the selection transistor 55. Also, when the reset transistor 56 drives according to a reset signal RST supplied from the vertical scanning circuit 13 and the reset transistor 56 is turned on, the charges accumulated in the FD unit 53 are discharged to the drain power source, and the FD unit 53 is reset.

The pixel 21 is configured in this manner, and the charges may be transferred from the pixel 21 to the PD 51 at the same timing in all the pixels 21, and as described above, the pixel signals may be read out a plurality of times according to the arrangement positions of the pixels 21. That is, by individually controlling the horizontal signal lines 22-1 and 22-2, the charges stored in the FD unit 53 in each pixel 21 at the time of exposure may be read out separately in four phases.

For example, the pixel signals output from the pixels 21 arranged in the odd-numbered columns and the odd-numbered rows are used for the first face detection processing, and the pixel signals output from the pixels 21 arranged in the even-numbered columns and the odd-numbered rows are used for the second face detection processing. Also, the pixel signals output from the pixels 21 arranged in the odd-numbered columns and the even-numbered rows are used for the third face detection processing, and the pixel signals output from the pixels 21 arranged in the even-numbered columns and the even-numbered rows are used for the first face detection processing.

Figure 3:
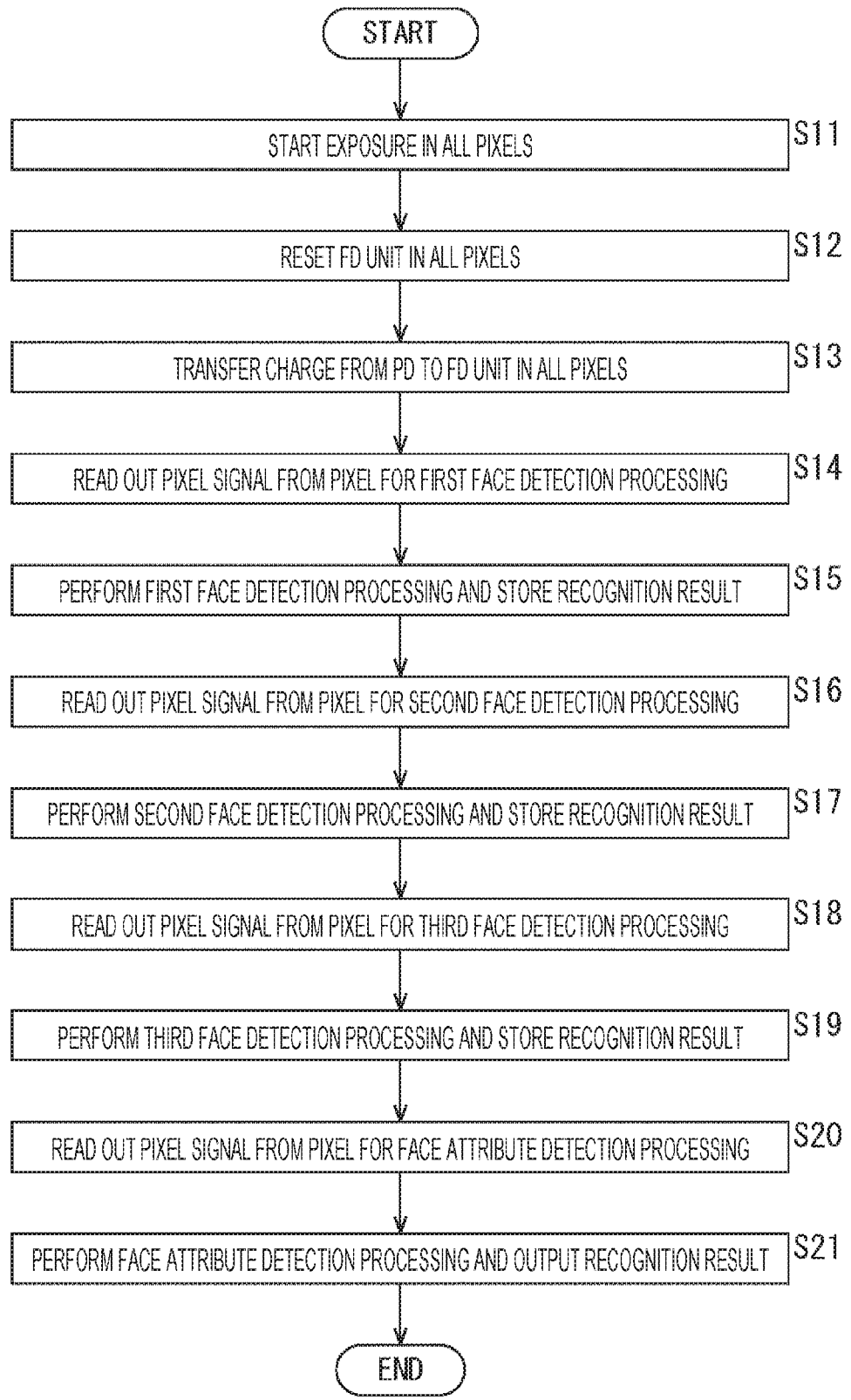
FIG. 3 is a flowchart for illustrating image recognition processing of detecting a face attribute.

Next, FIG. 3 is a flowchart for illustrating the image recognition processing of detecting the face attribute by the image sensor 11.

At step S11, the exposure is started in all the pixels 21. That is, the vertical scanning circuit 13 turns on the transfer signals TRX to the transfer transistor 52 of all the pixels 21 in a pulsed manner, so that the charges remaining in the PD 51 are transferred to the FD unit 53 via the transfer transistor 52 and the exposure of the PD 51 is started.

At step S12, the FD unit 53 is reset in all the pixels 21. That is, the vertical scanning circuit 13 turns on the reset signals RST to the reset transistor 56 of all the pixels 21 in a pulsed manner, so that the charges accumulated in the FD unit 53 are discharged to the drain power source via the reset transistor 56 and the FD unit 53 becomes empty of charges.

At step S13, the charges are transferred from the PD 51 to the FD unit 53 in all the pixels 21. That is, the vertical scanning circuit 13 turns on the transfer signals TRX to the transfer transistor 52 of all the pixels 21 in a pulsed manner, so that the charges subjected to the photoelectric conversion in predetermined exposure time and accumulated in the PD 51 are transferred to the FD unit 53 via the transfer transistor 52 to be stored in the FD unit 53.

At step S14, the pixel signals are read out from the pixels 21 for the first face detection processing. That is, the vertical scanning circuit 13 sequentially turns on the selection signals SEL to the selection transistor 55 of the pixels 21 connected to the horizontal signal lines 22-1 of the odd-numbered columns for the pixels 21 in the odd-numbered rows. As a result, the amplification transistor 54 of the selected pixel 21 is connected to the vertical signal line 23 via the selection transistor 55, and the pixel signal is read out.

At step S15, the face detection processing unit 31 performs the first face detection processing using the pixel signals read out from the pixels 21 for the first face detection processing, and stores the face detection information as the recognition result in the first face detection processing in the recognition result holding memory 32. That is, as described above, the face detection processing unit 31 detects the large-sized face in the first face detection processing.

At step S16, the pixel signals are read out from the pixels 21 for the second face detection processing. That is, the vertical scanning circuit 13 sequentially turns on the selection signals SEL to the selection transistor 55 of the pixels 21 connected to the horizontal signal lines 22-2 of the even-numbered columns for the pixels 21 in the odd-numbered rows. As a result, the amplification transistor 54 of the selected pixel 21 is connected to the vertical signal line 23 via the selection transistor 55, and the pixel signal is read out.

At step S17, the face detection processing unit 31 performs the second face detection processing using the pixel signals read out from the pixels 21 for the second face detection processing, and stores the face detection information being the recognition result in the second face detection processing in the recognition result holding memory 32. That is, as described above, the face detection processing unit 31 detects the medium-sized face in the second face detection processing.

At step S18, the pixel signals are read out from the pixels 21 for the third face detection processing. That is, the vertical scanning circuit 13 sequentially turns on the selection signals SEL to the selection transistor 55 of the pixels 21 connected to the horizontal signal lines 22-1 of the odd-numbered columns for the pixels 21 in the even-numbered rows. As a result, the amplification transistor 54 of the selected pixel 21 is connected to the vertical signal line 23 via the selection transistor 55, and the pixel signal is read out.

At step S19, the face detection processing unit 31 performs the third face detection processing using the pixel signals read out from the pixels 21 for the third face detection processing, and stores the face detection information being the recognition result in the third face detection processing in the recognition result holding memory 32. That is, as described above, the face detection processing unit 31 detects the small-sized face in the third face detection processing.

At step S20, the pixel signals are read from the pixels 21 for the face attribute detection processing. That is, the vertical scanning circuit 13 sequentially turns on the selection signals SEL to the selection transistor 55 of the pixels 21 connected to the horizontal signal lines 22-2 of the even-numbered columns for the pixels 21 in the even-numbered rows. As a result, the amplification transistor 54 of the selected pixel 21 is connected to the vertical signal line 23 via the selection transistor 55, and the pixel signal is read out.

At step S21, the face attribute detection processing unit 33 reads out the face detection information stored in the recognition result holding memory 32, and performs the face attribute detection processing using the pixel signals read out from the pixels 21 for the face attribute detection processing for the face with the position and the size based on the face detection information. Then, the face attribute detection processing unit 33 outputs the face attribute information being the recognition result in the face attribute detection processing.

As described above, the image sensor 11 may execute the image processing more efficiently, the image recognition processing in which a plurality of stages of processing such as the first face detection processing, the second face detection processing, the third face detection processing, and the face attribute detection processing is combined by appropriately reading out the pixel signals used in the processing at each stage.

Second Embodiment of Image Sensor

Figure 4:
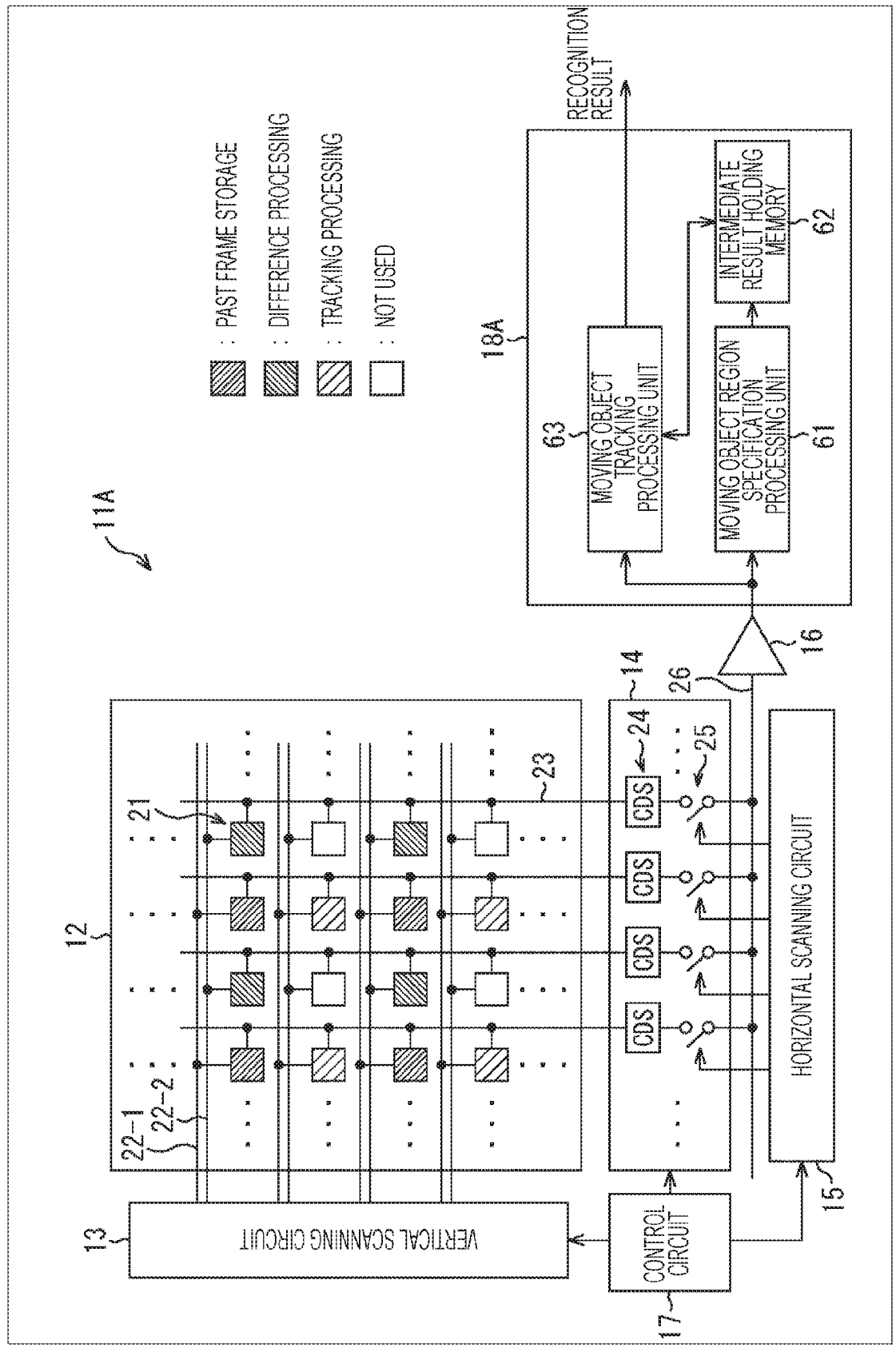
FIG. 4 is a block diagram illustrating a configuration example of a second embodiment of an image sensor.

Next, FIG. 4 is a block diagram illustrating a configuration example of a second embodiment of an image sensor to which the present technology is applied. Meanwhile, in an image sensor 11A illustrated in FIG. 4, the same reference sign is assigned to a component the same as that the image sensor 11 in FIG. 1, and the detailed description thereof is omitted.

As illustrated in FIG. 4, the image sensor 11A has the same configuration as that of the image sensor 11 in FIG. 1 in that this is provided with a pixel region 12, a vertical scanning circuit 13, a column signal processing circuit 14, a horizontal scanning circuit 15, an output circuit 16, and a control circuit 17. Then, the image sensor 11A is provided with a logic circuit 18A different from that of the image sensor 11.

That is, the logic circuit 18A of the image sensor 11A including a moving object region specification processing unit 61, an intermediate result holding memory 62, and a moving object tracking processing unit 63 may perform image recognition processing of tracking a moving object.

The moving object region specification processing unit 61 performs moving object region specification processing of specifying a region of the moving object which is present in a captured image.

The intermediate result holding memory 62 holds moving object region information (for example, a position and a size of a rectangular region in which the moving object is captured) as a recognition result obtained as a result of the moving object region specification processing performed by the moving object region specification processing unit 61.

The moving object tracking processing unit 63 reads out the recognition result held in the intermediate result holding memory 62 and associates the moving object captured in the captured image captured by the image sensor 11 in a time direction, thereby performing moving object tracking processing of obtaining a trajectory of the moving object. Then, the moving object tracking processing unit 63 outputs moving object tracking information (for example, an ID specifying the moving object and contour coordinates) obtained as a result of performing the moving object tracking processing to a block on a subsequent stage not illustrated.

Herein, the image sensor 11A may read out pixel signals a plurality of times according to arrangement positions of pixels 21, thereby performing image recognition processing which requires a plurality of times of processing in the logic circuit 18A as is the case with the image sensor 11 in FIG. 1. For example, the moving object region specification processing unit 61 may perform the moving object region specification processing using two captured images and the moving object tracking processing unit 63 may perform the moving object tracking processing by using one captured image out of three captured images supplied to the logic circuit 18.

For example, the moving object region specification processing unit 61 uses the captured image based on the pixel signals of the pixels 21 in the odd-numbered columns and the odd-numbered rows for past frame storage and uses the captured image based on the pixel signals of the pixels 21 in the even-numbered columns and the odd-numbered rows for difference processing of obtaining a difference from a past frame. As a result, the moving object region specification processing unit 61 performs the moving object region specification processing of specifying a moving object region on the basis of the difference between the two captured images. Then, the moving object tracking processing unit 63 performs the moving object tracking processing of tracking the moving object by using the captured image based on the pixel signals of the pixels 21 in the odd-numbered columns and the even-numbered rows. Meanwhile, the pixel signals of the pixels 21 in the even-numbered columns and the even-numbered rows are not read out, and the pixel signals of the pixels 21 are not used.

Figure 7:
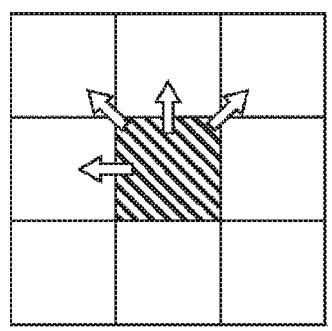
FIG. 7 is a view for illustrating peripheral pixels.

With reference to FIGS. 5 to 7, the moving object region specification processing by the moving object region specification processing unit 61 is described.

FIG. 5 is a view for illustrating an overall processing flow of the moving object region specification processing.

First, the moving object region specification processing unit 61 calculates a difference absolute value for each pixel of a luminance value between the past image based on the pixel signals read out from the pixels 21 for the past frame storage and a current image based on the pixel signals read out from the pixels 21 for the difference processing. Then, the moving object region specification processing unit 61 makes the pixel with the calculated difference absolute value equal to or larger than a predetermined threshold a moving object pixel. Furthermore, the moving object region specification processing unit 61 specifies a moving object region A including a rectangle circumscribing a cluster obtained by grouping adjacent moving object pixels.

FIG. 6 is a view for illustrating a method of obtaining the moving object region.

In FIG. 6, the moving object pixels are hatched, and the moving object region specification processing unit 61 performs raster scan on the pixels from an upper left side of a screen as indicated by outlined arrows to detect the moving object pixel. Then, when detecting the moving object pixel, the moving object region specification processing unit 61 determines whether another moving object pixel is already detected in peripheral pixels of the moving object pixel. Herein, as illustrated in FIG. 7, the peripheral pixels in the moving object region specification processing performed by the moving object region specification processing unit 61 are intended to mean the pixels adjacent to the pixel detected by the raster scan on an upper left side, an upper side, an upper right side, and a left side.

For example, in a case where another moving object pixel is not yet detected in the peripheral pixels of the detected moving object pixel, the moving object region specification processing unit 61 sets the moving object region A in this one pixel as illustrated in an upper part of FIG. 6. Thereafter, when the moving object region specification processing unit 61 continues the raster scan and newly detects the moving object pixel, this determines whether another moving object pixel is already detected in the peripheral pixels of the moving object pixel.

For example, as illustrated in the center of FIG. 6, in a case where there is an already detected moving object pixel on the upper right side of the newly detected moving object pixel, the moving object region specification processing unit

61 sets the moving object region A in a rectangular region circumscribing the moving object pixels. That is, in a case where the newly detected moving object pixel is located outside the already set moving object region A, the moving object region specification processing unit 61 enlarges the moving object region A so as to include the newly detected moving object pixel.

Hereinafter, similarly, when the moving object region specification processing unit 61 continues the raster scan and newly detects the moving object pixel, this repeats the processing of determining whether another moving object pixel is already detected in the peripheral pixels of the moving object pixel. As a result, as illustrated in a lower part of FIG. 6, it is possible to set the moving object region A so as to enclose all the detected moving object pixels.

Figure 8:
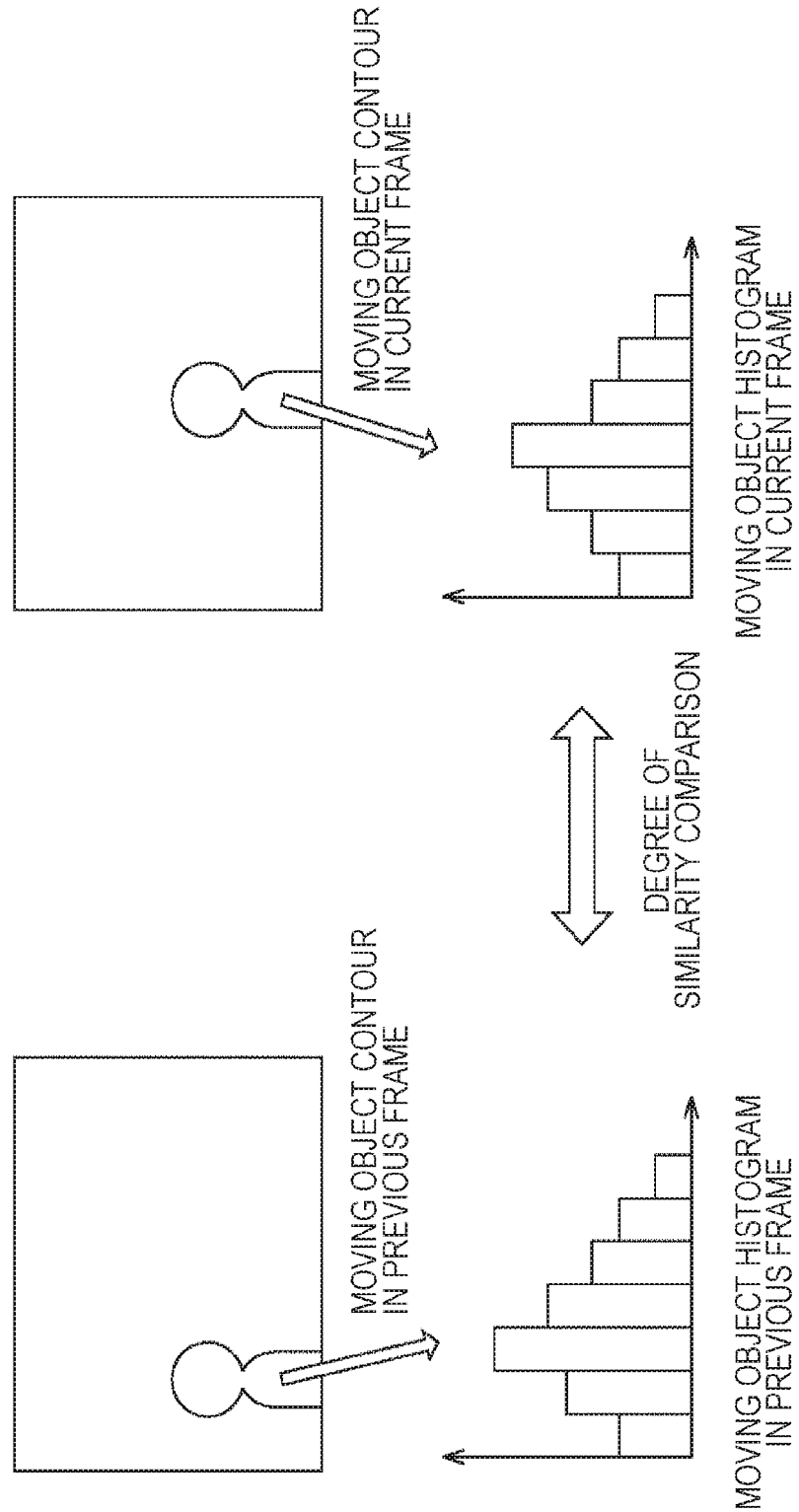
FIG. 8 is a view for illustrating moving object tracking processing.

With reference to FIG. 8, the moving object tracking processing by the moving object tracking processing unit 63 is described.

The moving object tracking processing unit 63 reads out the recognition result held in the intermediate result holding memory 62 and obtains a histogram of color information in the moving object region, for example, as a feature amount in the moving object region specified by the moving object region specification processing unit 61.

First, in a case where the moving object region is identified for the first time, the moving object tracking processing unit 63 assigns an identification ID for identifying the moving object region thereto and stores the identification ID together with coordinates of contour pixel group and the histogram in the intermediate result holding memory 62.

Also, in a case where the moving object region is already specified in a previous frame and the identification ID is registered in the intermediate result holding memory 62, the moving object tracking processing unit 63 first reads out the histogram associated with the identification ID of an arbitrary moving object region from the intermediate result holding memory 62. Then, the moving object tracking processing unit 63 compares the histogram read out from the intermediate result holding memory 62 with the histogram obtained from the moving object region of the current frame.

For example, the moving object tracking processing unit 63 makes an overlapping area of the histogram obtained from the moving object region of the previous frame and the histogram obtained from the moving object region of the current frame an index of a degree of similarity, and in a case where the degree of similarity is equal to or larger than a predetermined threshold, this determines that the moving object regions are for the same moving object. On the other hand, in a case where the degree of similarity is smaller than a predetermined threshold, the moving object tracking processing unit 63 reads out another histogram from the intermediate result holding memory 62, sequentially performs processing of determining the degree of similarity in a similar manner, and in a case where there is no moving object region for the same moving object, assigns a new identification ID as the moving object region for a new moving object.

Then, the moving object tracking processing unit 63 outputs the identification ID of the moving object region and the coordinates of the contour pixel group as a final recognition result.

Figure 9:
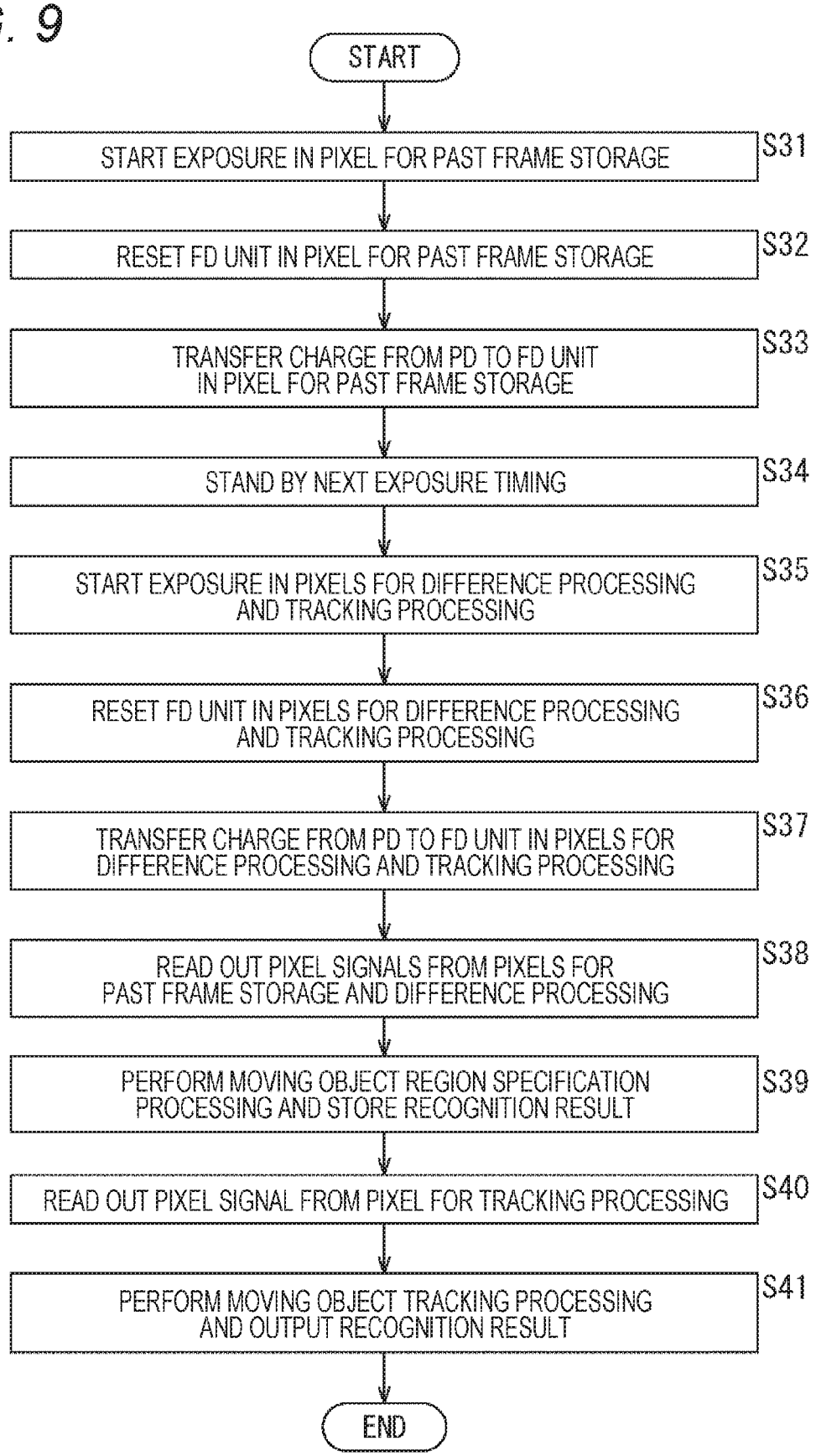
FIG. 9 is a flowchart for illustrating image recognition processing of performing moving object tracking.

Next, FIG. 9 is a flowchart illustrating the image recognition processing of performing the moving object tracking in the image sensor 11A.

At step S31, exposure of the pixels 21 for the past frame storage is started. That is, the vertical scanning circuit 13 turns on transfer signals TRX to a transfer transistor 52 of the pixels 21 for the past frame storage arranged in the odd-numbered columns and the odd-numbered rows in a pulse manner. As a result, charges remaining in a PD 51 of the pixels 21 are transferred to a FD unit 53 via the transfer transistor 52, and the exposure of the PD 51 is started.

At step S32, the FD unit 53 of the pixels 21 for the past frame storage is reset. That is, the vertical scanning circuit 13 turns on reset signals RST to a reset transistor 56 of the pixels 21 for the past frame storage arranged in the odd-numbered columns and the odd-numbered rows in a pulse manner. As a result, the charges accumulated in the FD unit 53 of the pixels 21 are discharged to a drain power source via the reset transistor 56, and the FD unit 53 becomes empty of charges.

At step S33, the charges are transferred from the PD 51 to the FD unit 53 in the pixels 21 for the past frame storage. That is, the vertical scanning circuit 13 turns on the transfer signals TRX to the transfer transistor 52 of the pixels 21 for the past frame storage arranged in the odd-numbered columns and the odd-numbered rows in a pulse manner. As a result, in the pixels 21, the charges subjected to photoelectric conversion in a predetermined exposure time and accumulated in the PD 51 are transferred to the FD unit 53 via the transfer transistor 52 to be stored in the FD unit 53.

At step S34, the processing stands by for a certain period of time until next exposure timing.

At step S35, the exposure of the pixels 21 for the difference processing and tracking processing is started. That is, the vertical scanning circuit 13 turns on the transfer signals TRX to the transfer transistor 52 in the pixels 21 for the difference processing arranged in the even-numbered columns and the odd-numbered rows and the pixels 21 for the tracking processing arranged in the odd-numbered columns and the even-numbered rows in a pulse manner. As a result, charges remaining in a PD 51 of the pixels 21 are transferred to a FD unit 53 via the transfer transistor 52, and the exposure of the PD 51 is started.

At step S36, the FD unit 53 of the pixels 21 for the difference processing and the tracking processing is reset. That is, the vertical scanning circuit 13 turns on the reset signal RST to the reset transistor 56 in a pulse manner for the pixels 21 for the difference processing arranged in the even-numbered columns and the odd-numbered rows and the pixels 21 for the tracking processing arranged in the odd-numbered columns and the even-numbered rows. As a result, the charges accumulated in the FD unit 53 of the pixels 21 are discharged to a drain power source via the reset transistor 56, and the FD unit 53 becomes empty of charges.

At step S37, the charges are transferred from the PD 51 to the FD unit 53 in the pixels 21 for the difference processing and the tracking processing. That is, the vertical scanning circuit 13 turns on the transfer signals TRX to the transfer transistor 52 in a pulse manner for the pixels 21 for the difference processing arranged in the even-numbered columns and the odd-numbered rows and the pixels 21 for the tracking processing arranged in the odd-numbered columns and the even-numbered rows. As a result, in the pixels 21, the charges subjected to photoelectric conversion in a predetermined exposure time and accumulated in the PD 51 are transferred to the FD unit 53 via the transfer transistor 52 to be stored in the FD unit 53.

At step S38, the pixel signals are read out from the pixels 21 for the past frame storage and the difference processing. That is, the vertical scanning circuit 13 sequentially turns on the selection signals SEL to the selection transistor 55 of the pixels 21 connected to the horizontal signal lines 22-1 and 22-2 for the pixels 21 in the odd-numbered rows. As a result, the amplification transistor 54 of the selected pixel 21 is connected to the vertical signal line 23 via the selection transistor 55, and the pixel signal is read out.

At step S39, the moving object region specification processing unit 61 performs the moving object region specification processing using the pixel signals read out from the pixels 21 for the past frame storage and the difference processing, and stores the moving object region being the recognition result in the moving object region specification processing in the intermediate result holding memory 62. That is, as described with reference to FIG. 5, the moving object region specification processing unit 61 specifies the moving object region in the moving object region specification processing.

At step S40, the pixel signals are read out from the pixels 21 for the tracking processing. That is, the vertical scanning circuit 13 sequentially turns on the selection signals SEL to the selection transistor 55 of the pixels 21 connected to the horizontal signal lines 22-1 of the pixels 21 in the even-numbered columns. As a result, the amplification transistor 54 of the selected pixel 21 is connected to the vertical signal line 23 via the selection transistor 55, and the pixel signal is read out.

At step S41, the moving object tracking processing unit 63 performs the moving object tracking processing using the pixel signals read out from the pixels 21 for the tracking processing as described above with reference to FIG. 8. Then, the moving object tracking processing unit 63 outputs the identification ID of the moving object region and the coordinates of the contour pixel group being the recognition result in the moving object tracking processing.

As described above, the image sensor 11A may execute the image recognition processing more efficiently, the image recognition processing in which a plurality of stages of processing such as the moving object region specification processing and the moving object tracking processing is combined by appropriately reading out the pixel signals used in the processing at each stage.

Second Configuration Example of Pixel 21

Figure 10:
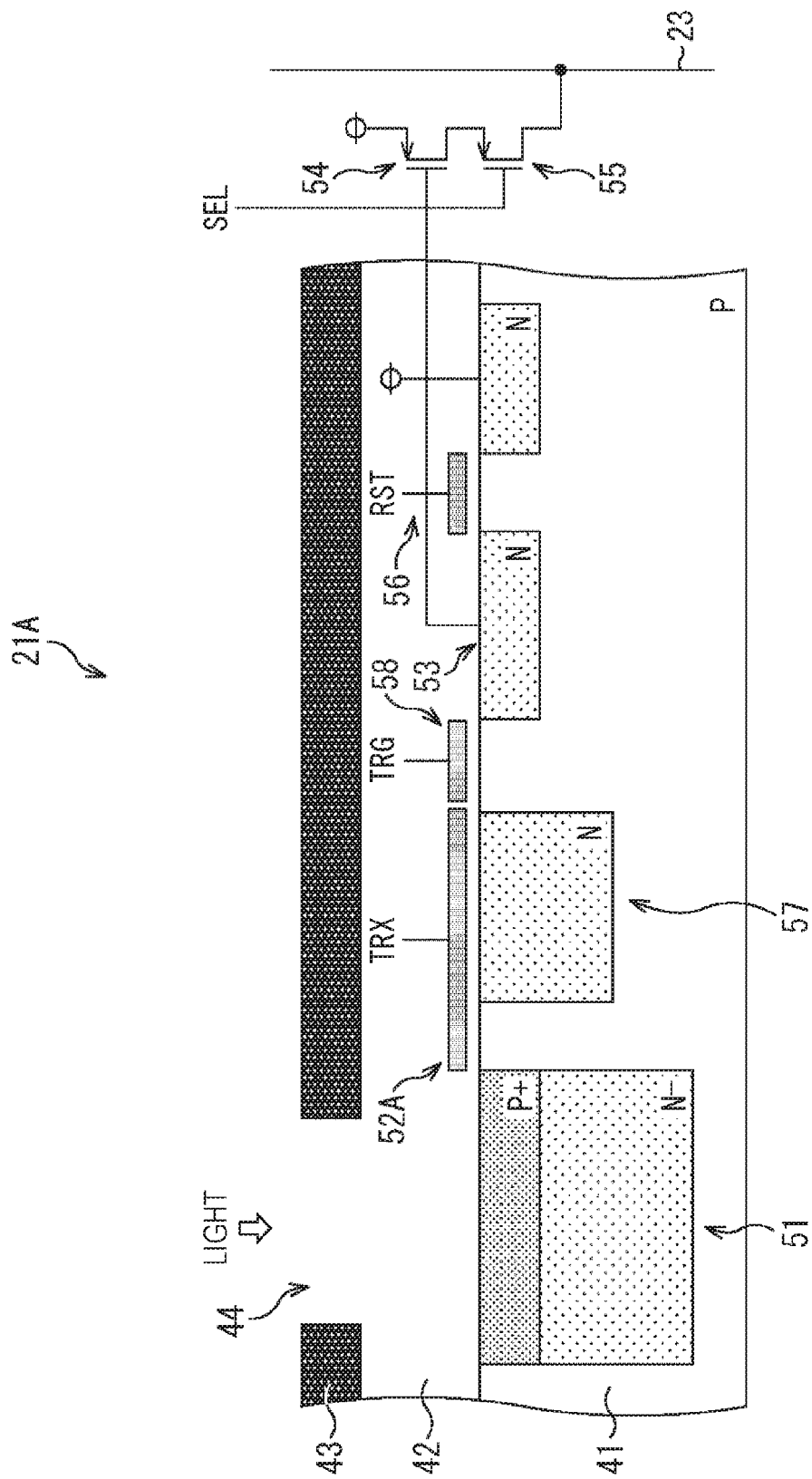
FIG. 10 is a view illustrating a second configuration example of a pixel.

Next, FIG. 10 is a view illustrating a second configuration example of the pixel 21. Meanwhile, in a pixel 21A illustrated in FIG. 10, the same reference sign is assigned to a component the same as that of the pixel 21 in FIG. 2, and the detailed description thereof is omitted.

As illustrated in FIG. 10, the image sensor 11 includes a semiconductor substrate 41, a wiring layer 42, and a light shielding film 43 stacked on one another. Also, the pixel 21 is provided with the PD 51, a transfer transistor 52A, the FD unit 53, the amplification transistor 54, the selection transistor 55, the reset transistor 56, a memory unit 57, and a readout transistor 58.

That is, the pixel 21A has a configuration different from that of the pixel 21 in FIG. 2 in further including the memory unit 57 and the readout transistor 58 and in that a gate electrode of the transfer transistor 52A is formed so as to cover the memory unit 57.

In the pixel 21A configured in this manner, the charges are transferred from the PD 51 to the memory unit 57 by driving the transfer transistor 52A, and the charges are held in the memory unit 57 until a timing at which the pixel signal is read out from the pixel 21A. Then, at the timing at which the pixel signal is read out from the pixel 21A, the charges are transferred from the memory unit 57 to the FD unit 53 by driving the readout transistor 58, and the pixel signal is read.

As described above, the pixel 21A includes the memory unit 57 serving as an in-pixel memory unit separately from the PD 51, so that this may output the pixel signal with lower noise than that of the pixel 21, for example. Therefore, by using the low-noise pixel signal, the image sensor 11 including the pixels 21A may improve recognition accuracy of the image recognition processing.

Meanwhile, the image recognition processing executed in the image sensor 11 is not limited only to the processing of detecting the face attribute and the processing of tracking the moving object, but this may be applied to any image recognition processing as long as this is to read the image a plurality of times and perform the processing of a plurality of stages.

Also, while the pixel signals may be read out from the memory unit 57 in FIG. 10 only once, the pixel signals may be read out a plurality of times from the FD unit 53 in FIG. 2, and it is possible to realize the image recognition processing of more variations by reading out a plurality of times from the same pixel 21. However, in a case of reading the pixel signals a plurality of times from the FD unit 53, noise due to dark current increases as the FD unit 53 holds the charges for a long period of time, so that it is required to suppress deterioration in image quality. Furthermore, as the structure of the pixel 21, in addition to the structures as illustrated in FIGS. 2 and 10, any structure may be adopted as long as this is the structure provided with the in-pixel memory unit which holds the charges.

The image sensor 11 having the above-described structure may realize a plurality of types of processing dependent on each other in a sensor chip with a limited resource even with the structure in which the frame memory for storing the image of one frame is not provided in the logic circuit. As a result, the image sensor 11 may realize the processing which is not conventionally realistic in terms of cost and power with a realistic circuit scale. Therefore, it becomes possible to realize a very wide variety of functions only with the image sensor 11, which may greatly contribute to downsizing and cost reduction of a set. Also, by performing to the detection processing within the image sensor 11, it becomes possible to output only the detection result without outputting the image, so that it is possible to provide substantial sense of security in a system in which the image can never leak to outside such as monitoring and watching of a private space.

Configuration Example of Electronic Device

Meanwhile, the image sensor 11 of each embodiment described above may be applied to various electronic devices such as an imaging system such as a digital still camera and a digital video camera, a mobile phone having an imaging function, or another device having the imaging function, for example.

Figure 11:
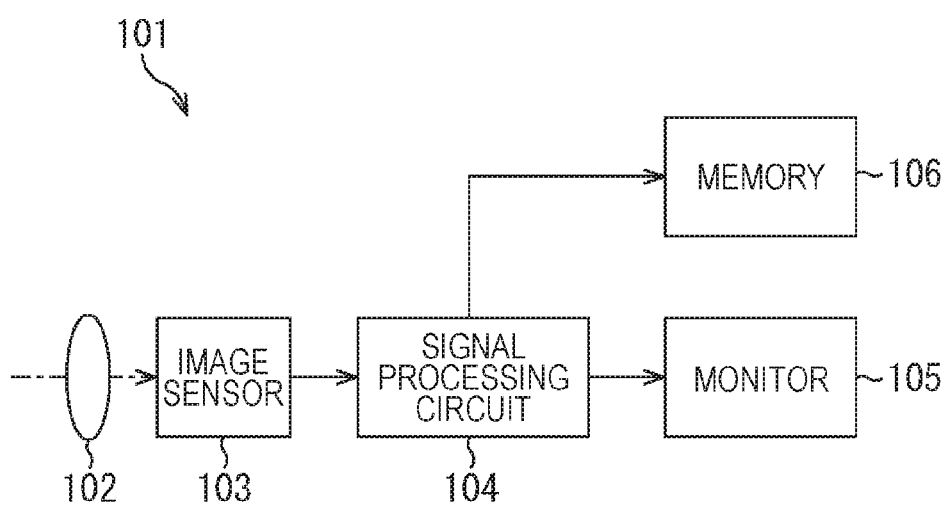
FIG. 11 is a block diagram illustrating a configuration example of one embodiment of an electronic device to which the present technology is applied.

FIG. 11 is a block diagram illustrating a configuration example of an imaging apparatus mounted on the electronic device.

As illustrated in FIG. 11, an imaging apparatus 101 provided with an optical system 102, an image sensor 103, a signal processing circuit 104, a monitor 105, and a memory 106 may capture a still image and a moving image.

The optical system 102 including one or a plurality of lenses guides image light from a subject (incident light) to the image sensor 103 to form an image on a light-receiving surface (sensor unit) of the image sensor 103.

As the image sensor 103, the image sensor 11 of each of the above-described embodiments is applied. Electrons are accumulated in the image sensor 103 for a certain period according to the image formed on the light-receiving surface via the optical system 102. Then, a signal corresponding to the electrons accumulated in the image sensor 103 is supplied to the signal processing circuit 104.

The signal processing circuit 104 performs various types of signal processing on the pixel signal output from the image sensor 103. The image (image data) obtained by the signal processing applied by the signal processing circuit 104 is supplied to the monitor 105 to be displayed or supplied to the memory 106 to be stored (recorded).

In the imaging apparatus 101 configured in this manner, by applying the image sensor 11 according to each of the above-described embodiments, for example, it is possible to output the recognition result obtained by executing the image recognition processing efficiently in the image sensor 11.

Usage Example of Image Sensor

Figure 12:
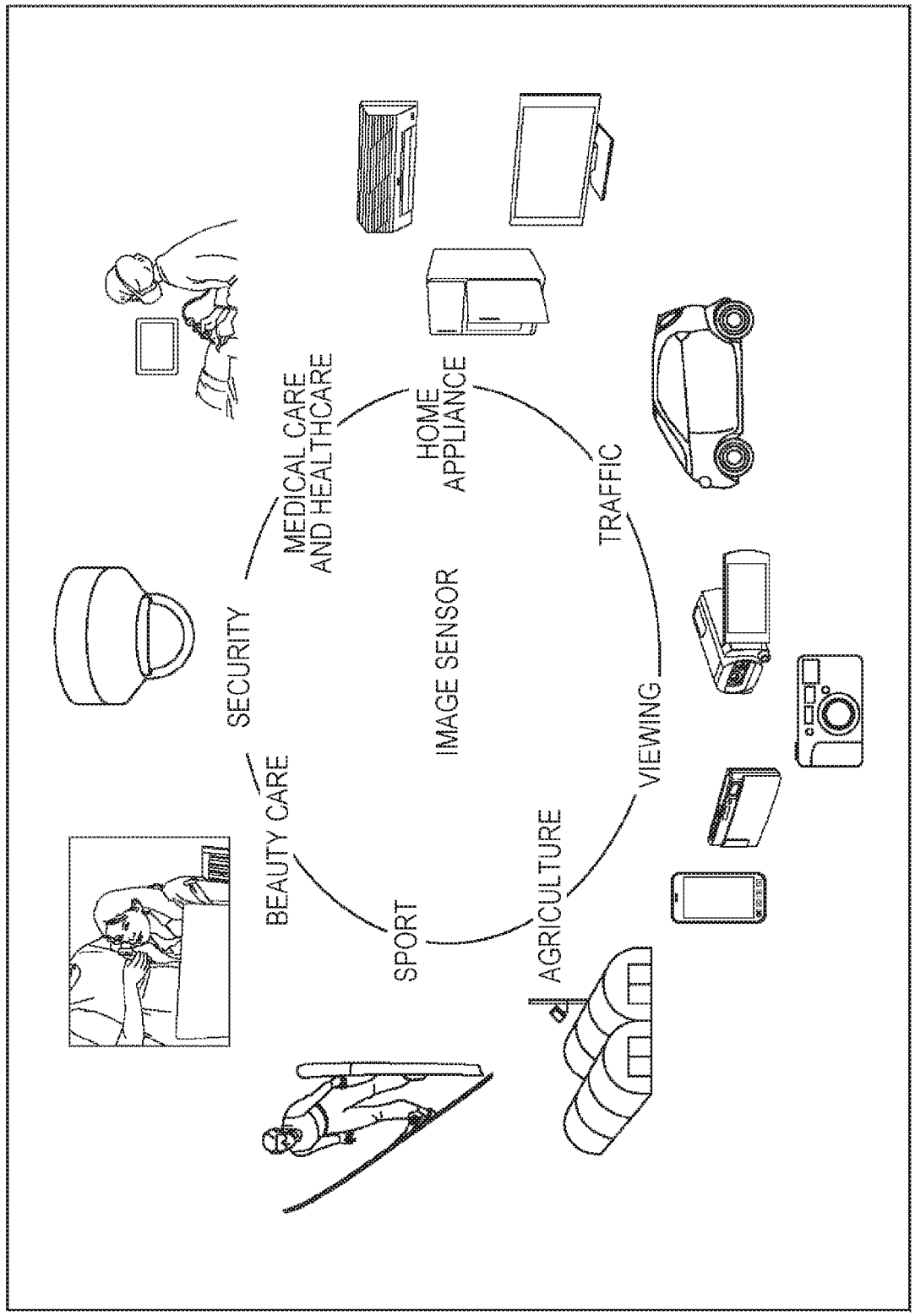
FIG. 12 is a view illustrating a usage example of using an image sensor.

FIG. 12 is a view illustrating a usage example of using the above-described image sensor.

The above-described image sensor may be used in various cases in which light such as visible light, infrared light, ultraviolet light, and X-ray is sensed as follows, for example.

- A device which takes an image to be used for viewing such as a digital camera and a portable device with a camera function
- A device for traffic purpose such as an in-vehicle sensor which takes images of the front, rear, surroundings, interior and the like of an automobile, a monitoring camera for monitoring traveling vehicles and roads, and a ranging sensor which measures a distance between vehicles and the like for safe driving such as automatic stop and recognition of a driver's condition
- A device for home appliance such as a television, a refrigerator, and an air conditioner which takes an image of a user's gesture and performs device operation according to the gesture
- A device for medical and healthcare use such as an endoscope and a device which performs angiography by receiving infrared light
- A device for security use such as a security monitoring camera and an individual certification camera
- A device for beauty care such as a skin condition measuring device which takes an image of skin and a microscope which takes an image of scalp
- A device for sporting use such as an action camera and a wearable camera for sporting use and the like
- A device for agricultural use such as a camera for monitoring land and crop states Meanwhile, the present technology may also have following configurations.

(1)
An image sensor including:
a pixel region in which pixels each including a photoelectric conversion unit which converts light to a charge and an in-pixel memory unit which holds the charge generated in the photoelectric conversion unit are arranged in a matrix manner;
a driving unit which drives to read out a pixel signal from the pixel; and
an image processing unit which performs image processing based on a plurality of images read out by a plurality of times of readout from the pixel region according to driving of the driving unit.

(2)
The image sensor according to (1) described above, in which the image processing unit includes:
a preprocessing unit which performs preprocessing a plurality of times using pixel signals read out from the pixel region a plurality of times;
a holding unit which holds a processing result by the preprocessing unit; and
a postprocessing unit which performs postprocessing using the processing result held in the holding unit and the pixel signals read out from the pixel region.

(3)
The image sensor according to (1) or (2) described above, in which the in-pixel memory unit is a floating diffusion region used as a conversion unit which converts the charge into the pixel signal.

(4)
The image sensor according to (1) or (2) described above, in which the in-pixel memory unit is a charge holding unit provided between the floating diffusion region and the photoelectric conversion unit.

(5)
An image processing method of an image sensor provided with a pixel region in which pixels each including a photoelectric conversion unit which converts light to a charge and an in-pixel memory unit which holds the charge generated in the photoelectric conversion unit are arranged in a matrix manner, and a driving unit which drives to read out a pixel signal from the pixel, the method including:
performing image processing based on a plurality of images read out by a plurality of times of readout from the pixel region according to driving of the driving unit.

(6)
An electronic device including:
an image sensor including:
a pixel region in which pixels each including a photoelectric conversion unit which converts light to a charge and an in-pixel memory unit which holds the charge generated in the photoelectric conversion unit are arranged in a matrix manner;
a driving unit which drives to read out a pixel signal from the pixel; and
an image processing unit which performs image processing based on a plurality of images read out by a plurality of times of readout from the pixel region according to driving of the driving unit.

Meanwhile, this embodiment is not limited to the above-described embodiment and may be variously changed without departing from the scope of the present disclosure.

REFERENCE SIGNS LIST

11 Image sensor
12 Pixel region
13 Vertical scanning circuit
14 Column signal processing circuit
15 Horizontal scanning circuit
16 Output circuit
17 Control circuit
18 Logic circuit
21 Pixel
22-1 and 22-2 Horizontal signal line
23 Vertical signal line
24 Data output signal line
31 Face detection processing unit
32 Recognition result holding memory
33 Face attribute detection processing unit 41 Semiconductor substrate
42 Wiring layer
43 Light shielding film
44 Opening
51 PD
52 Transfer transistor
53 FD unit
54 Amplification transistor
55 Selection transistor
56 Reset transistor
57 Memory unit
58 Readout transistor

The invention claimed is:

1. An image sensor, comprising:
a pixel region including a plurality of pixels arranged in a matrix, wherein
each pixel of the plurality of pixels includes a photoelectric conversion unit and an in-pixel memory unit,
the photoelectric conversion unit is configured to generate a charge, and
the in-pixel memory unit is configured to hold the generated charge;
a driving unit configured to read out, a first plurality of times, pixel signals from the plurality of pixels based on a selection of a first set of pixels of the plurality of pixels in odd-numbered columns and odd-numbered rows, a selection of a second set of pixels of the plurality of pixels in even-numbered columns and the odd-numbered rows, and a selection of a third set of pixels of the plurality of pixels in the even-numbered columns and even-numbered rows; and
an image processing unit configured to:
read out, a second plurality of times, a plurality of images from the pixel region based on the read out of the pixel signals from the plurality of pixels, wherein
a first image of the plurality of images is read out based on the selection of the first set of pixels of the plurality of pixels in the odd-numbered columns and the odd-numbered rows,
a second image of the plurality of images is read out based on the selection of the second set of pixels of the plurality of pixels in the even-numbered columns and the odd-numbered rows, and
a third image of the plurality of images is read out based on the selection of the third set of pixels of the plurality of pixels in the even-numbered columns and the even-numbered rows;
detect a first face from the first image the selection of the first set of pixels of the plurality of pixels in the odd-numbered columns and the odd-numbered rows;
detect a second face from the second image based on the selection of the second set of pixels of the plurality of pixels in the even-numbered columns and the odd-numbered rows, wherein a size of the detected first face is larger than a size of the detected second face; and
execute a face attribute detection process based on the third image of the plurality of images and the selection of the third set of pixels of the plurality of pixels in the even-numbered columns and the even-numbered rows.

2. The image sensor according to claim 1, wherein the image processing unit includes:
a preprocessing unit configured to detect the first face from the first image and the second face from the second image based on the read out of the pixel signals from the plurality of pixels;
a holding unit configured to hold a result of the detection of the first face and a result of the detection of the second face; and
a postprocessing unit configured to execute the face attribute detection process based on:
the result of the detection of the first face and the result of the detection of the second face held in the holding unit, and
the read out of the pixel signals from the plurality of pixels.

3. The image sensor according to claim 1, wherein
the in-pixel memory unit is a floating diffusion region which serves as a conversion unit, and
the conversion unit is configured to convert the charge into a pixel signal.

4. The image sensor according to claim 1, wherein
the in-pixel memory unit is a charge holding unit, and
the charge holding unit is between a floating diffusion region and the photoelectric conversion unit.

5. An image processing method, comprising:
in an image sensor that includes a pixel region, a driving unit, and an image processing unit, wherein the pixel region includes a plurality of pixels arranged in a matrix, each pixel of the plurality of pixels includes a photoelectric conversion unit and an in-pixel memory unit, the photoelectric conversion unit is configured to generate a charge, and the in-pixel memory unit is configured to hold the generated charge:
reading out, by the driving unit, a first plurality of times, pixel signals from the plurality of pixels based on a selection of a first set of pixels of the plurality of pixels in odd-numbered columns and odd-numbered rows, a selection of a second set of pixels of the plurality of pixels in even-numbered columns and the odd-numbered rows, and a selection of a third set of pixels of the plurality of pixels in the even-numbered columns and even-numbered rows;
reading out, by the image processing unit, a second plurality of times, a plurality of images from the pixel region based on the read out of the pixel signals from the plurality of pixels, wherein
a first image of the plurality of images is read out based on the selection of the first set of pixels of the plurality of pixels in the odd-numbered columns and the odd-numbered rows,
a second image of the plurality of images is read out based on the selection of the second set of pixels of the plurality of pixels in the even-numbered columns and the odd-numbered rows, and
a third image of the plurality of images is read out based on the selection of the third set of pixels of the plurality of pixels in the even-numbered columns and the even-numbered rows;
detecting, by the image processing unit, a first face from the first image based on the selection of the first set of pixels of the plurality of pixels in the odd-numbered columns and the odd-numbered rows;
detecting, by the image processing unit, a second face from the second image based on the selection of the second set of pixels of the plurality of pixels in the even-numbered columns and the odd-numbered rows, wherein a size of the detected first face is larger than a size of the detected second face; and
executing, by the image processing unit, a face attribute detection process based on the third image of the plurality of images and the selection of the third set of pixels of the plurality of pixels in the even-numbered columns and the even-numbered rows.

6. An electronic device, comprising:
an image sensor that includes:
   a pixel region including a plurality of pixels arranged in a matrix, wherein
      each pixel of the plurality of pixels includes a photoelectric conversion unit and an in-pixel memory unit,
      the photoelectric conversion unit is configured to generate a charge, and
      the in-pixel memory unit is configured to hold the generated charge;
   a driving unit configured to read out, a first plurality of times, pixel signals from the plurality of pixels based on a selection of a first set of pixels of the plurality of pixels in odd-numbered columns and odd-numbered rows, a selection of a second set of pixels of the plurality of pixels in even-numbered columns and the odd-numbered rows, and a selection of a third set of pixels of the plurality of pixels in the even-numbered columns and even-numbered rows; and
an image processing unit configured to:
   read out, a second plurality of times, a plurality of images from the pixel region based on the read out of the pixel signals from the plurality of pixels, wherein
      a first image of the plurality of images is read out based on the selection of the first set of pixels of the plurality of pixels in the odd-numbered columns and the odd-numbered rows,
      a second image of the plurality of images is read out based on the selection of the second set of pixels of the plurality of pixels in the even-numbered columns and the odd-numbered rows, and
      a third image of the plurality of images is read out based on the selection of the third set of pixels of the plurality of pixels in the even-numbered columns and the even-numbered rows;
   detect a first face from the first image the selection of the first set of pixels of the plurality of pixels in the odd-numbered columns and the odd-numbered rows;
   detect a second face from the second image based on the selection of the second set of pixels of the plurality of pixels in the even-numbered columns and the odd-numbered rows, wherein a size of the detected first face is larger than a size of the detected second face; and
   execute a face attribute detection process based on the third image of the plurality of images and the selection of the third set of pixels of the plurality of pixels in the even-numbered columns and the even-numbered rows.

7. The image sensor according to claim 2, wherein the result of the detection of the first face includes a position and a size of a region corresponding to the detected first face in the first image.

* * * * *